(12) United States Patent
Hong et al.

(10) Patent No.: US 11,462,141 B2
(45) Date of Patent: Oct. 4, 2022

(54) DISPLAY DEVICE WITH FREE SHAPE DISPLAY PANEL

(71) Applicant: InnoLux Corporation, Miao-Li County (TW)

(72) Inventors: Shuo-Ting Hong, Miao-Li County (TW); Hung-Kun Chen, Miao-Li County (TW); Ting-Yao Chu, Miao-Li County (TW); Yen-Lin Gau, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 17/342,674

(22) Filed: Jun. 9, 2021

(65) Prior Publication Data

US 2022/0020307 A1     Jan. 20, 2022

(30) Foreign Application Priority Data

Jul. 17, 2020    (CN) .......................... 202010690331.8

(51) Int. Cl.
    *G09G 5/00*      (2006.01)
    *G09G 3/20*      (2006.01)
    (Continued)

(52) U.S. Cl.
    CPC ........... *G09G 3/20* (2013.01); *G02F 1/13452* (2013.01); *G02F 1/136286* (2013.01);
    (Continued)

(58) Field of Classification Search
    CPC ............. G09G 3/20; G09G 2300/0426; G09G 2310/0297; G09G 2300/023;
    (Continued)

(56) References Cited

U.S. PATENT DOCUMENTS

2015/0199936 A1*   7/2015   Watanabe ............ G09G 3/3685
                                                         345/100
2015/0243683 A1*   8/2015   Lee ..................... H01L 27/1237
                                                          257/40

(Continued)

FOREIGN PATENT DOCUMENTS

EP          3 121 851 A2     1/2017
EP          3 621 059 A1     3/2020

OTHER PUBLICATIONS

Extended European Search Report dated Dec. 2, 2021, issued in application No. EP 21180927.2.

*Primary Examiner* — Adam J Snyder
(74) *Attorney, Agent, or Firm* — McClure, Qualey & Rodack, LLP

(57) ABSTRACT

A display device includes a first display area, a second display area, a first multiplexer, and a second multiplexer. The first display area includes a plurality of first data lines. The second display area is adjacent to the first display area and includes a plurality of second data lines. The first multiplexer is electrically connected to one of the first data lines. The second multiplexer is electrically connected to one of the second data lines. The first data line is electrically connected to a first number of sub-pixels. The second data line is electrically connected to a second number of sub-pixels. The first number is less than the second number. The size of the first multiplexer is smaller than that of the second multiplexer.

17 Claims, 6 Drawing Sheets

(51) Int. Cl.
  *G02F 1/1345* (2006.01)
  *G02F 1/1362* (2006.01)
  *G09F 9/33* (2006.01)
  *H01L 27/15* (2006.01)
  *H01L 27/32* (2006.01)

(52) U.S. Cl.
  CPC ......... *G09F 9/33* (2013.01); *G09G 2300/023* (2013.01); *G09G 2300/0426* (2013.01); *G09G 2310/0278* (2013.01); *G09G 2310/0281* (2013.01); *G09G 2310/0297* (2013.01); *G09G 2320/0209* (2013.01); *G09G 2320/0214* (2013.01); *G09G 2320/0223* (2013.01); *H01L 27/156* (2013.01); *H01L 27/3244* (2013.01)

(58) Field of Classification Search
  CPC ... G09G 2310/0278; G09G 2320/0209; G09G 2320/0214; G09G 2320/0223; G09F 9/33; G02F 1/13452; G02F 1/136286; H01L 27/156; H01L 27/3244
  See application file for complete search history.

(56) References Cited

U.S. PATENT DOCUMENTS

| | | |
|---|---|---|
| 2015/0255030 A1* | 9/2015 | Watsuda .............. G09G 3/3648 345/92 |
| 2016/0125844 A1 | 5/2016 | Lee |
| 2017/0123285 A1* | 5/2017 | Suzuki ................. G09G 3/3688 |
| 2018/0129111 A1 | 5/2018 | Wu et al. |
| 2019/0096978 A1 | 3/2019 | Jung et al. |

* cited by examiner

DISPLAY DEVICE WITH FREE SHAPE DISPLAY PANEL

CROSS REFERENCE TO RELATED APPLICATIONS

This application claims priority to and the benefit of China Application No. 202010690331.8, filed on Jul. 17, 2020, the entirety of which is incorporated by reference herein.

FIELD OF THE DISCLOSURE

The disclosure is related to a display device, and in particular it is related to a display area than can improve the feed-through effect of the multiplexer in the display area.

DESCRIPTION OF THE RELATED ART

In a non-rectangular (free shape) display panel, the number of sub-pixels connected to data lines in different positions in the display area may be different, which makes the load (RC loading) of the data lines in different positions in the display area different. At this moment, the parasitic capacitance of the multiplexer (MUX) inside the panel may affect the charging of the corresponding sub-pixels, so that the data line with a small number of sub-pixels may suffer a greater feed-through effect, and the inconsistency of the feed-through effect may affect the display quality.

BRIEF SUMMARY OF THE DISCLOSURE

In order to resolve the issue described above, the present disclose provides a display device. The display device includes a first display area, a second display area, a first multiplexer, and a second multiplexer. The first display area includes a plurality of first data lines. The second display area is adjacent to the first display area, and includes a plurality of second data lines. The first multiplexer is electrically connected to one of the first data lines. The second multiplexer is electrically connected to one of the second data lines. The first data line is electrically connected to a first number of sub-pixels. The second data line is electrically connected to a second number of sub-pixels. The first number is less than the second number. The size of the first multiplexer is smaller than that of the second multiplexer.

BRIEF DESCRIPTION OF THE DRAWINGS

The disclosure can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration. This means that many special details, relationships and methods are disclosed to provide a complete understanding of the disclosure.

DETAILED DESCRIPTION OF THE DISCLOSURE

Figure 1:
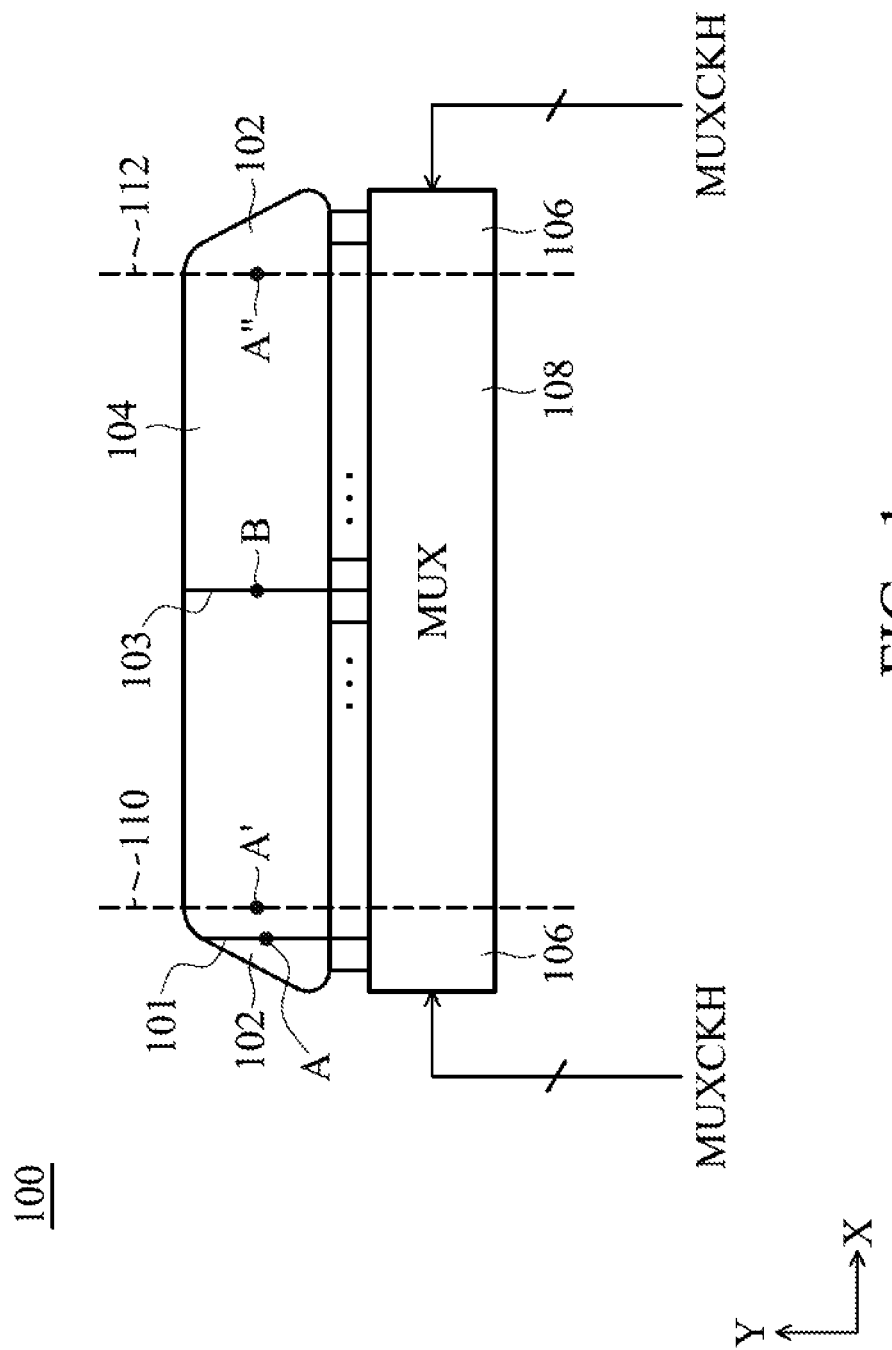
FIG. 1 is a schematic diagram of a display device in accordance with some embodiments of the disclosure.

In order to make the above purposes, features, and advantages of some embodiments of the present disclosure more comprehensible, the following is a detailed description in conjunction with the accompanying drawings.

Certain terms are used throughout the description and following claims to refer to particular components. As one skilled in the art will understand, electronic equipment manufacturers may refer to a component by different names. This document does not intend to distinguish between components that differ in name but not function. It should be understood that the words "comprise", "have" and "include" are used in an open-ended fashion, and thus should be interpreted to mean "include, but not limited to . . . ". Thus, when the terms "comprise", "have" and/or "include" used in the present disclosure are used to indicate the existence of specific technical features, values, method steps, operations, units and/or components. However, it does not exclude that more technical features, numerical values, method steps, work processes, units, components, or any combination of the above can be added.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component(s) may exist between them. On the other hand, when the component is referred to "directly on another component (or the variant thereof)", any component does not exist between them. Furthermore, when the corresponding component is referred to "on another component", the corresponding component and another component have a disposition relationship along a top-view/vertical direction, the corresponding component may be below or above another component, and the disposition relationship along the top-view/vertical direction are determined by an orientation of the device.

It will be understood that when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented.

The electrical connection or coupling described in this disclosure may refer to direct connection or indirect connection. In the case of direct connection, the endpoints of the components on the two circuits are directly connected or connected to each other by a conductor line segment, while in the case of indirectly connected, there are switches, diodes, capacitors, inductors, resistors, other suitable components, or a combination of the above components between the endpoints of the components on the two circuits, but the intermediate component is not limited thereto.

The words "first", "second", "third", "fourth", "fifth", and "sixth" are used to describe components, they are not used to indicate the priority order of or advance relationship, but only to distinguish components with the same name.

It should be noted that the technical features in different embodiments described in the following can be replaced, recombined, or mixed with one another to constitute another embodiment without departing from the spirit of the present disclosure.

In the present disclosure, the display device can be any suitable type of display device or electronic device with a display panel, such as a touch display, an antenna device, a splicing device, a sensing device, a flexible device, etc., but the present is not limited thereto. The electronic device described in the present disclosure may be a touch display integrated with touch and display functions, and the display panel may include liquid crystal (LC), organic light-emitting diode (OLED), inorganic light-emitting diode (light-emitting diode, LED) such as micro-LED, mini-LED, sub-millimeter light-emitting diode (mini-LED), quantum dot light-emitting diode (QLED, QDLED), fluorescent material, phosphor material, quantum dots (QDs) material, other suitable materials or a combination of the above materials, but the present disclosure is not limited thereto. The splicing device may be, for example, a display splicing device or an antenna splicing device, but the present disclosure is not limited thereto. In addition, the display panel in the electronic device may be a color display panel or a monochrome display panel, and the shape of the display panel can be a rectangle, a circuit, a polygon, a shape with a curved edge, or other suitable shapes.

FIG. 1 is a schematic diagram of a display device in accordance with some embodiments of the disclosure. As shown in FIG. 1, the display device 100 includes a first display area 102, a second display area 104, a peripheral area 106 where a first multiplexer is located, and a peripheral area 108 where a second multiplexer is located. The first display area 102 is adjacent to the second display area 104. As shown in FIG. 1, in some embodiments, the first display area 102 are arranged on both sides of the second display area 104, the peripheral area 106 is adjacent to the first display area 102, and the peripheral area 108 is adjacent to the second display area 104, but the present disclosure is not limited thereto. In FIG. 1, point A' and point A" are reference points used to separate the first display area 102 and the second display area 104. The positions of point A' and point A" may correspond to the sub-pixels of the display device, but the present disclosure is not limited thereto. In some embodiments, point A' and/or point A" may be located between two adjacent sub-pixels. It should be noted that, in the present disclosure, point A' (point A") may be selected as the reference point of the boundary in the area where the appearance of the display panel of the display device begins to change significantly (for example, the junction of the rectangular area 104 and the approximately triangular area 102 in FIG. 1), however the appearance change of the panel disclosed in the present disclosure is not limited to FIG. 1. In some embodiments, the display device 100 of the present disclosure uses the longitudinal tangent line 110 passing through point A' and extending along a Y direction (the extension direction of the display panel data line in the display device 100) in FIG. 1 and the longitudinal tangent line 112 passing through point A" and extending along the Y direction in FIG. 1 as the separation boundary of the first display area 102 and the second display area 104, respectively. In some embodiments, the first display area 102 includes a plurality of first data lines, and the second display area 104 includes a plurality of second data lines.

In some embodiments, in the first display area 102, at least one of the first data lines is electrically connected to a first number of sub-pixels. In the second display area 104, at least one of the second data lines is electrically connected to a second number of sub-pixels. Since the display panel may be non-rectangular, in some embodiments, the first number is smaller than the second number. For example, the first data line 101 corresponding to point A is located in the first display area 102, and the second data line 103 corresponding to point B is located in the second display area 104. The number of sub-pixels electrically connected to the first data line 101 is less than the number of sub-pixels electrically connected to the second data line 103. The first multiplexer (not shown) located in the peripheral area 106 may be electrically connected to the first data line 101, and the second multiplexer (not shown) located in the peripheral area 108 may be electrically connected to the second data line 103. In some embodiments, the size of the first multiplexer is smaller than that of the second multiplexer. In some embodiments, the control signal group MUXCKH is used to respectively turn in or turn off the first multiplexer located in the peripheral area 106 and the second multiplexer located in the peripheral area 108 (more specifically, to turn on or switch the switching element in the multiplexer).

Figure 2:
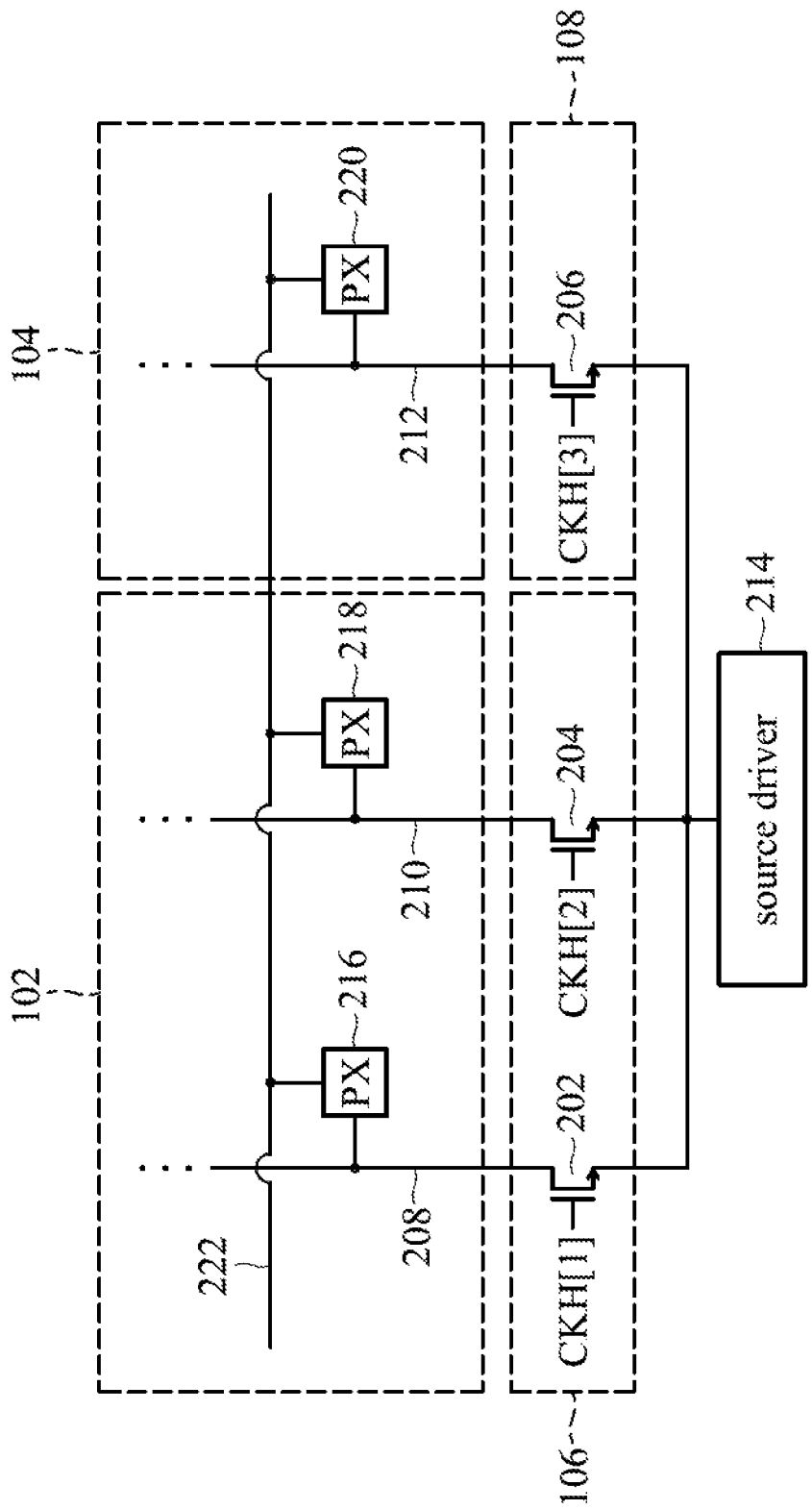
FIG. 2 is a schematic diagram of a first display area, a second display area and peripheral areas in FIG. 1 in accordance with some embodiments of the disclosure.

FIG. 2 is a schematic diagram of a first display area 102, a second display area 104 and peripheral areas 106 and 108 in FIG. 1 in accordance with some embodiments of the disclosure. In some embodiments, the first multiplexer and the second multiplexer may each include at least one thin-film transistor (TFT). Therefore, in FIG. 2, thin-film transistors are used to represent the first multiplexer and the second multiplexer, respectively. In addition, although the present disclosure takes n-type TFTs as an example, the present disclosure is not limited thereto. In some embodiments, p-type TFTs may also be used.

In FIG. 2, the peripheral area 106 includes a first multiplexer 202 and a first multiplexer 204, and the peripheral area 108 includes a second multiplexer 206, but the number of first multiplexers and the second multiplexers in the present disclosure is not limited thereto. The first multiplexer 202, the first multiplexer 204 and the second multiplexer 206 are all electrically connected to a source driver 214, but the present disclosure is not limited thereto. In some embodiments, due to considerations during the design of the display device (such as the size or appearance of the display panel in the display device), different multiplexers are electrically connected to different source drivers. A control signal CKH[1] may be used to turn on or turn off the first multiplexer 202. A control signal CKH[2] may be used to turn on or turn off the first multiplexer 204. A control signal CKH[3] may be used to turn on or turn off the second multiplexer 206. In some embodiments, the control signals CKH[1], CKH[2] and CKH[3] in FIG. 2 are included in the control signal group MUXCKH in FIG. 1. In some embodiments, the control signals CKH[1], CKH[2] and CKH[3] in FIG. 2 and the control signal group MUXCKH in FIG. 1 are from a multiplexer controller (not shown).

In FIG. 2, the first multiplexer 202 in the peripheral area 106 is electrically connected to a data line 208 in the first display area 102, and a sub-pixel 216 is electrically connected to the data line 208 and a scan line 222. The first multiplexer 204 is electrically connected to a data line 210, and a sub-pixel 218 is electrically connected to the data line 210 and the scan line 222. The second multiplexer 206 is electrically connected to a data line 212, and a sub-pixel 220 is electrically connected to the data line 212 and the scan line 222. Taking the data line 208 as an example, since the TFT in the first multiplexer 202 in FIG. 2 is an n-type TFT, when the control signal CKH[1] changes from a low level to a high level, the first multiplexer 202 is turned on, and the source driver 214 charges a storage capacitor (not shown) in the sub-pixel 216 through the data line 208. FIG. 2 uses the data line 208 and the data line 210 in the first display area 102 respectively electrically connected to one sub-pixel (for example, the sub-pixel 216 and the sub-pixel 218) as an example. In the practical application of the present disclosure, at least one of the data line 208 and the data line 210 in the first display area 102 may be electrically connected to a first number (for example, 60) of sub-pixels, and the data line 212 in the second display area 104 may be electrically connected to a second number (for example, 100) of sub-pixels. Since the number of sub-pixels connected to the data lines in different display areas may be different, the load of the data lines in different display areas may also be different. At this moment, the parasitic capacitance of the multiplexer in the display device may affect the charging of the corresponding sub-pixels, so that the data lines that are electrically connected to a small number of sub-pixels may suffer a greater feed-through effect (sudden drop in driving voltage). The inconsistency of the feed-through effect may affect the display quality. At this time, by adjusting the size of the multiplexer, for example, making the size of the first multiplexer smaller than the size of the second multiplexer, the parasitic capacitance of the multiplexer may be changed, and the impact of the inconsistency of the feed-through effect on the image quality may be reduced.

Figure 4:
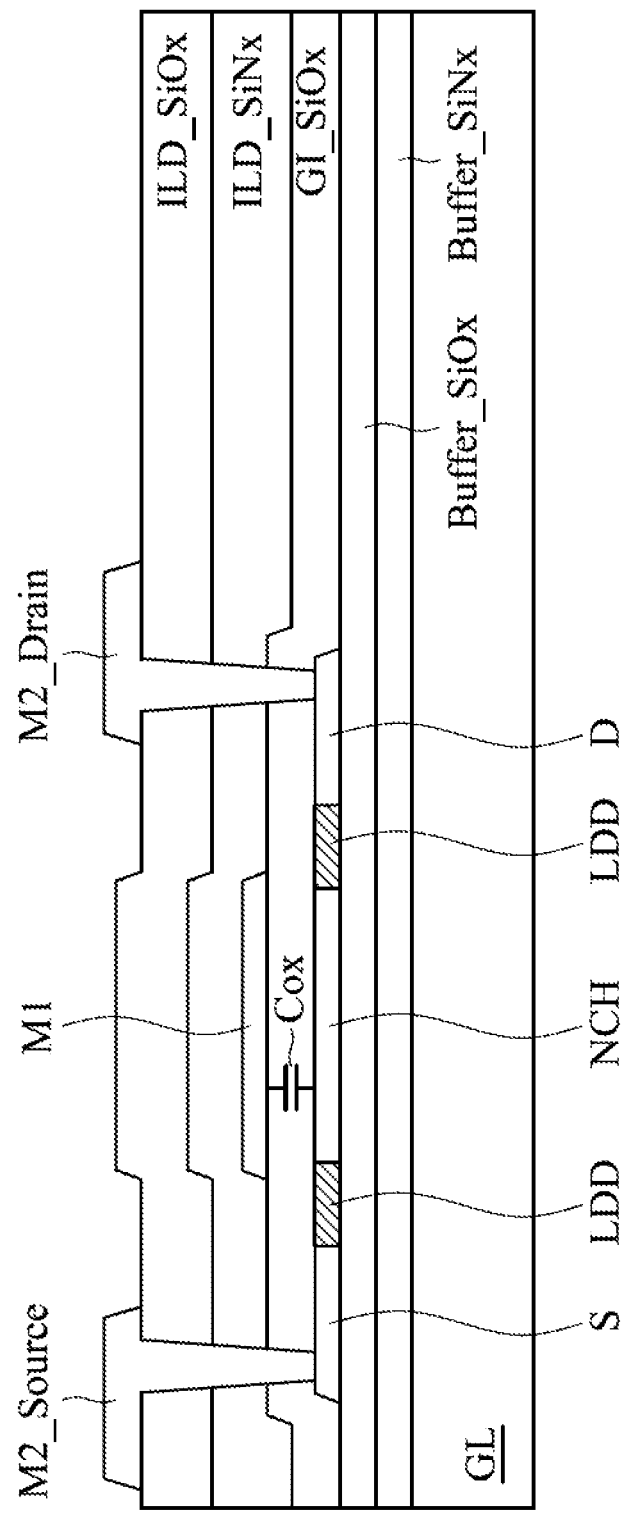
FIG. 4 is a schematic diagram of the cross-sectional structure of a thin-film transistor included in a multiplexer in accordance with some embodiments of the disclosure.

FIG. 4 is a schematic diagram of the cross-sectional structure of a thin-film transistor included in a multiplexer in accordance with some embodiments of the disclosure. As shown in FIG. 4, the TFT in the multiplexer may be formed on the glass substrate GL, the TFT may include, but us not limited to, a silicon nitride buffer layer Buffer_SiNx, a silicon oxide buffer layer Buffer_SiOx, a semiconductor layer (including a source S, a drain D, a channel layer NCH, and a lightly doped layer LDD), a gate insulating layer GI_SiOx, a silicon nitride interlayer dielectric layer ILD_SiNx, and a silicon oxide interlayer dielectric layer ILD_SiOx. The source S, the drain D, the channel layer NCH, and the lightly doped layer LDD are formed between the silicon oxide buffer layer Buffer_SiOx and the gate insulating layer GI_SiOx. Moreover, the TFT may also include a source electrode M2_Source, which is electrically connected to the source S of the TFT, and a drain electrode M2_Drain, which is electrically connected to the drain D of the TFT. The metal layer M1 forms the gate the TFT. As shown in FIG. 4, the parasitic capacitance Cox is formed at the polysilicon material between the metal layer M1 and the channel layer NCH (for example, the gate insulating layer GI_SiOx). It should be noted that the structure and material of the TFT shown in FIG. 4 is an example, but the present disclosure is not limited thereto. For example, in some embodiments, the gate of the TFT may be located under the channel layer NCH, or a single TFT contains multiple gates.

Referring to FIG. 1, FIG. 2, and FIG. 4 at the same time, and taking the first multiplexer 204 and the second multiplexer 206 in FIG. 2 as an example, when the control signal CKH[2] and the control signal CKH[3] changes from a high level to a low level, the TFTs in the first multiplexer 204 and the second multiplexer 206 are turned off. Affected by the difference in the number of sub-pixels connected to the first data line 210 and the second data line 212 individually, and the parasitic capacitance Cox of the TFT in the multiplexer shown in FIG. 4, the feed-through effect generated by the first multiplexer 204 and the second multiplexer 206 after being turned off may be inconsistent, resulting in abnormal display of the display device 100.

Figure 5:
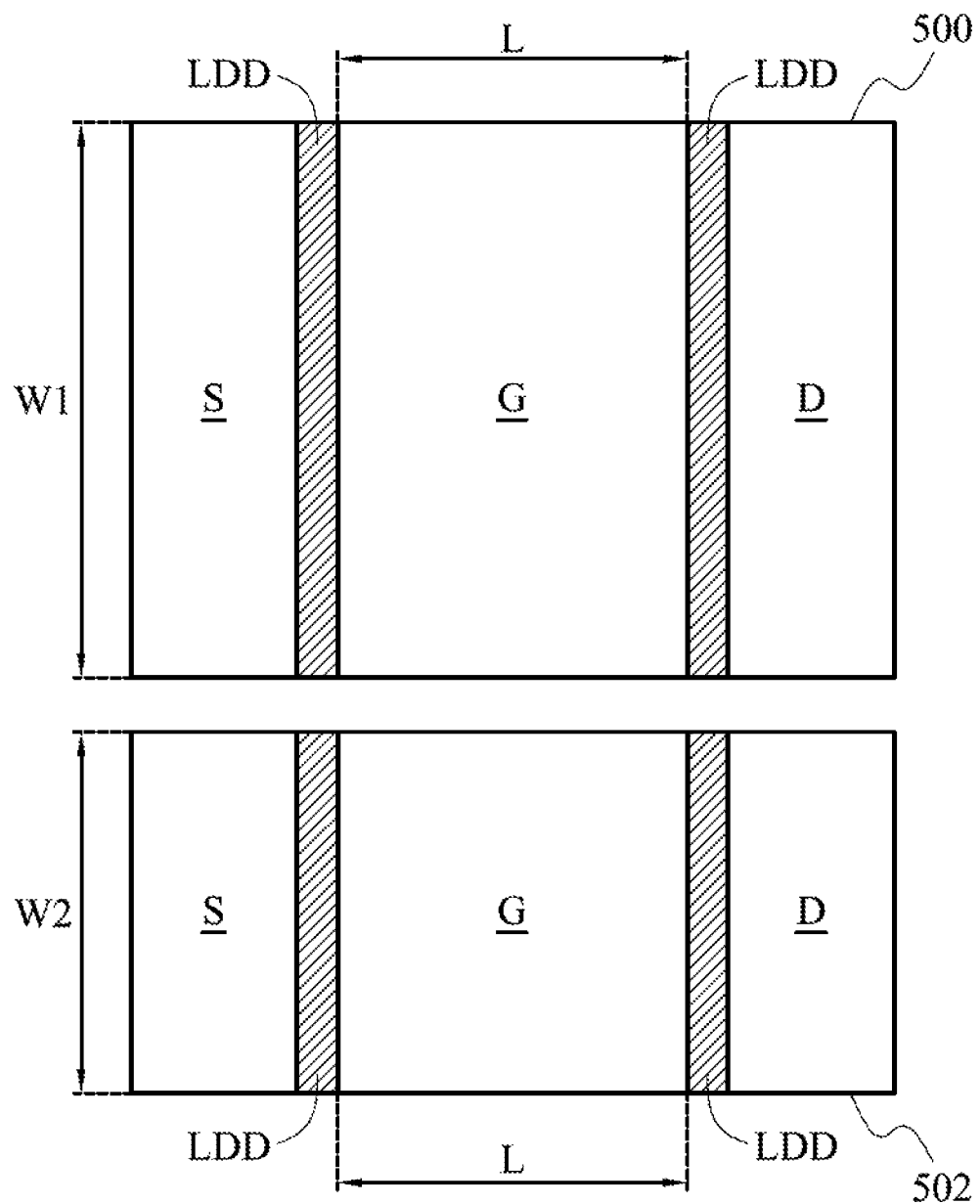
FIG. 5 is a schematic diagram of the channel width of the thin-film transistor included in the multiplexer in accordance with some embodiments of the disclosure.

The size of the multiplexer is related to the channel length and channel width of the TFT. Please refer to FIG. 1, FIG. 2, FIG. 4, and FIG. 5. FIG. 5 is a schematic diagram of the channel width of the thin-film transistor included in the multiplexer in accordance with some embodiments of the disclosure. More specifically, the TFT 500 shown in FIG. 5 may represent a schematic diagram of the layout of the TFT included in the second multiplexer 206 in FIG. 2, and the TFT 502 may represent a schematic diagram of the layout of the TFT included in the first multiplexer 204 in FIG. 2. In FIG. 5, the channel length of the TFT 500 in the second multiplexer 206 is L, and the channel width is W1. The channel length of the TFT 502 in the first multiplexer 204 is also L, and the channel width is W2. The channel width W2 is less than the channel width W1. At this time, the size of the first multiplexer may be defined as W2/L, and the size of the second multiplexer may be defined as W1/L. It should be noted that the schematic diagram of the layout of the TFT in FIG. 5 is an example for convenience of explanation, and the method of defining the channel length and channel width may vary according to the actual structure. The shaded area in FIG. 5 is the lightly doped layer LDD in FIG. 4. The source $\underline{S}$ in FIG. 5 may correspond to the source S in FIG. 4. The drain $\underline{D}$ in FIG. 5 may correspond to the drain D in FIG. 4. In some embodiments, the second multiplexer 206 corresponding to the TFT 500 is electrically connected to the second data line 103 corresponding to the point B in the second display area 104 of FIG. 1. The first multiplexer 204 corresponding to the TFT 502 is electrically connected to the first data line 101 corresponding to the point A in the first display area 102 of FIG. 1.

As described above, the present disclosure adjusts the channel width of the TFTs included in different multiplexers in different display areas to adjust the feed-through effect caused by the parasitic capacitance Cox in different TFTs. The present disclosure reduces the uneven display quality caused by the inconsistency of the feed-through effect when the corresponding multiplexer is turned on and off in different display areas.

For example, please refer to FIG. 2 and FIG. 5 at the same time, in some embodiments, the channel width W1 of the TFT 500 in the second multiplexer 206 is set as 50 μm, and the channel width W2 of the TFT 502 in the first multiplexer 204 is set as 20 μm. When the second multiplexer 206 is turned on, the source driver 214 in FIG. 2 provides a 6V voltage to charge the sub-pixels electrically connected to the second multiplexer 206, so that a 5.96061V voltage (referred to as the third voltage) may be measured on the drain $\underline{D}$ (where it is electrically connected to the sub-pixels through the second data line 212) of the TFT 500 in the second multiplexer 206. When the second multiplexer 206 is turned off, a 5.88505V voltage (referred to as the fourth voltage)

may be measured on the drain D of the TFT 500. Similarly, when the first multiplexer 204 is turned on, the source driver 214 in FIG. 2 provides a 6V voltage to charge the sub-pixels electrically connected to the first multiplexer 204, so that a 5.97581V voltage (referred to as the first voltage) may be measured on the drain D (where it is electrically connected to the sub-pixels through the second data line 210) of the TFT 502 in the first multiplexer 204. When the first multiplexer 204 is turned off, a 5.89706V voltage (referred to as the second voltage) may be measured on the drain D of the TFT 502. According to the above measurement data, in this measurement, the feed-through effect in the first multiplexer 204 (5.97581V−5.89706V=0.07875V) is quite close to the feed-through effect in the second multiplexer 206 (5.96061V−5.8805V=0.08011V). At this time, the feed-through effects of the first multiplexer 204 and the second multiplexer 206 may be regarded as substantially the same.

In addition, the channel width W1 of the TFT 500 in the second multiplexer 206 is still set as 50 μm, and the channel width W2 of the TFT 502 in the first multiplexer 204 is amended from 20 μm to 50 μm, so that the channel width W2 is the same as the channel width W1. When the first multiplexer 204 is turned on, the source driver 214 in FIG. 2 provides a 6V voltage to charge the sub-pixels electrically connected to the first multiplexer 204, so that a 5.99868V voltage (referred to as the first voltage) may be measured on the drain D of the TFT 502. When the first multiplexer 204 is turned off, a 5.82734V voltage (referred to as the second voltage) may be measured on the drain D of the TFT 502. At this time, the feed-through effect of the first multiplexer 204 increases to 0.17134V(5.99868V−5.82734V=0.17134V). according to the above data, when the channel width W2 of the TFT 502 of the first multiplexer 204 is 20 μm, and the channel width W1 of the TFT 500 of the second multiplexer 206 is 50 μm, the feed-through effect of the first multiplexer 204 is quite close to the feed-through effect of the second multiplexer 206. However, when the channel width W2 of the TFT 502 of the first multiplexer 204 is 50 μm (equal to the channel width W1 of the TFT 500 of the second multiplexer 206), the feed-through effect of the first multiplexer 204 is increased to about twice the feed-through effect of the second multiplexer 206. In other words, when the first multiplexer 204 corresponding to fewer sub-pixels still maintains the same TFT channel width as the second multiplexer 206 corresponding to more sub-pixels (that is, when the size of the multiplexers is the same), the feed-through effect caused by the parasitic capacitance Cox in the TFT 502 of the first multiplexer 204 may be more serious. At this time, the feed-through effects of the first multiplexer 204 and the second multiplexer 206 may be regarded as inconsistent. It should be noted that the above result is an example. In this disclosure, the size of the TFT and the feed-through effect of each multiplexer may be different depending on the actual product.

Please refer to FIG. 2 and FIG. 5. In some embodiments, in order to reduce the inconsistency of the feed-through effect caused by different factor pixels, the size of different multiplexers may have the following relationship:

$$M' = a \times M \quad \text{equation 1}$$

$$a = \frac{1}{(N+1) - N \times e^{(k-1)}}, N = 1 \sim 10 \quad \text{equation 2}$$

$$k = \frac{p'}{P_{max}} \quad \text{equation 3}$$

M' is the size of the first multiplexer 204, M is the size of the second multiplexer 206. a is a size conversion constant. k is a pixel scale constant. p' is the number if sub-pixels electrically connected by the first multiplexer 204 through the first data line (such as the data line 210). N is a parameter for selection, and is a positive integer from 1 to 10 ($1 \leq N \leq 10$). $P_{max}$ is the number of sub-pixels electrically connected by the second multiplexer 206 through the second data line 212. In some embodiments, the number of sub-pixels electrically connected to the second data line 212 is the maximum of the number of sub-pixels electrically connected to all the second data lines in the second display area 104, but the present disclosure is not limited thereto.

For example, in the embodiment of FIG. 5, the size of the multiplexer is related to the channel width of the TFT in FIG. 5 (for example, the channel width W2 of the TFT 502 of the first multiplexer 204 and the channel width W1 of the TFT 500 of the second multiplexer 206), but the present disclosure is not limited thereto. Please refer to FIG. 1, FIG. 2 and FIG. 5 at the same time. When the channel lengths are all L, first, the channel width W1 of the TFT 500 included in the second multiplexer 206 is set to 50 μm. The present disclosure defines the point A' between the point A and the point B in FIG. 1 to divide the first display area 102 and the second display area 104. At this time, the point A is located in the first display area 102, and the point B is located in the second display area 104. In addition, the point A" may also be defined in a similar manner, so that the number of sub-pixels electrically connected to any one of the first data lines between the point A' (or the point A") and the side edge of the display device 100 (that is, the first display area 102) is less than the number of sub-pixels electrically connected to any of the second data lines in the second display area. It should be noted that, in some embodiments, the present disclosure does not limit the division of the display device 100 into two display areas, and the display device 100 may also be divided into more display areas. However, equations 1 to 3 may still be used to estimate the size of the corresponding multiplexer in each display area. In some embodiments, the appearance of the display panel of the display device may cause the sub-pixels electrically connected to each data line to be different. At this time, equations 1~3 may still be used to estimate the size of the multiplexer corresponding to each data line. For example, when the number of sub-pixels electrically connected to the first data line 101 corresponding to the point A is 247, and the number of sub-pixels electrically connected to the second data line 103 corresponding to the point B is 392, p'=247 and $P_{max}$=392 is substituted into equation 3, and the pixel scale constant k equal to 0.63 is obtained.

Then, the present disclosure substitutes k=0.63 and N=1~10 into equation 2 respectively, and when N=1, the size conversion constant a is equal to 0.763. When N=2, the size conversion constant a is equal to 0.617. When N=3, the size conversion constant a is equal to 0.51. When N=4, the size conversion constant a is equal to 0.45. When N=5, the size conversion constant a is equal to 0.392. When N=6, the size conversion constant a is equal to 0.35. When N=7, the size conversion constant a is equal to 0.315. When N=8, the size conversion constant a is equal to 0.287. When N=9, the size conversion constant a is equal to 0.263. When N=10, the size conversion constant a is equal to 0.24. Generally, the size conversion constant a is between 0.13 and 1 (0.13≤a≤1). After that, the present disclosure substitutes each size conversion constant a obtained under the condition of N=1~10 into equation 1. At this time, the size of the multiplexer in the second display area may be set according to actual requirements (such as customer specifications), for example, the channel width W1 of the TFT 500 in the second multiplexer 206 is set as 50 μm, and the recommended values of the channel width W2 of the TFT 502 in the first multiplexer 204 are 38 μm, 31 μm, 26 μm, 23 μm, 20 μm, 18 μm, 16 μm, 14 μm, 13 μm, and 12 μm.

Finally, the present disclosure inputs the above recommended values into a semiconductor simulation software to simulate that when the channel width W2 of the TFT 502 of the first multiplexer 204 and the channel width W1 of the TFT 500 of the second multiplexer 206 are maintained at 50 μm, one of the recommended values, which makes the feed-through effect of the first multiplexer 204 the closest to the feed-through effect of the second multiplexer 206, is set as the channel width W2 of the TFT 502 of the first multiplexer 204. It should be noted that the above result is an example, and the size of the TFT and the feed-through effect of each multiplexer in the present disclosure may be different depending on the actual product.

Figure 3:
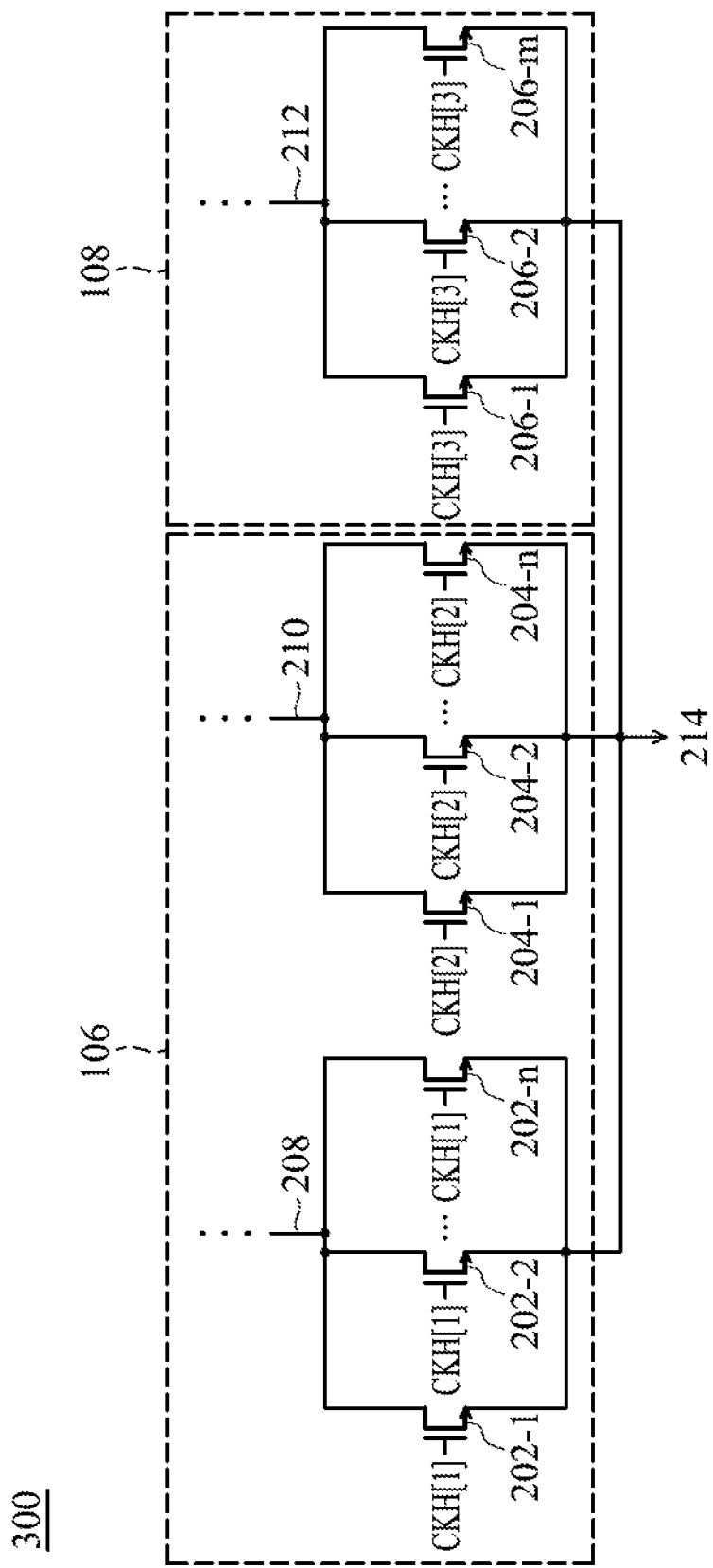
FIG. 3 is a schematic diagram of the peripheral areas in accordance with some embodiments of the disclosure.

Please refer to FIG. 3. FIG. 3 is a schematic diagram of the peripheral areas in accordance with some embodiments of the disclosure. The difference between each multiplexer in the multiplexer group 300 in FIG. 3 and the first multiplexers 202 and 204 and the second multiplexer 206 in FIG. 2 is that each multiplexer in the multiplexer group 300 in FIG. 3 may include a plurality of TFTs. For example, the first multiplexer in FIG. 3 may include n TFTs 202-1, 202-2, ... , 202-n in parallel with each other to replace the first multiplexer 202 in FIG. 2. Similarly, the second multiplexer in FIG. 3 may include m TFTs 206-1, 206-2, ... , 206-m in parallel with each other to replace the second multiplexer 206 in FIG. 2, and the remaining first multiplexer and second multiplexer may be analogized. n and m are positive integers greater than or equal to 2, and n and m may be the same or different. The sources of the TFTs 202-1, 202-2, ... , 202-n, 204-1, 204-2, ... , 204-n, 206-1, 206-2, ... , 206-m are all electrically connected to the source driver 214, but the present disclosure is not limited thereto. In some embodiments, due to considerations during the design of the display device (for example, factors such as the size or appearance of the display device), different multiplexers may be electrically connected to different source drivers.

The difference between the above embodiment and the embodiment in FIG. 2 is that the size of a single multiplexer is adjusted by the number of parallel TFTs. Since the size of multiplexers may be superimposed through parallel connection of TFTs, when the size of each TFT is approximately the same, and the number of TFTs corresponding to the first multiplexer is less than the number of TFTs corresponding to the second multiplexer (n<m), the size of the first multiplexer may be made smaller than that of the second multiplexer.

As mentioned above, since the number of sub-pixels electrically connected to the data lines in different display areas may be different, the load of the data lines in different display areas may be different. At this time, the parasitic capacitance of the multiplexer in the display device may affect the charging of the corresponding sub-pixels, so that the data line with a small number of sub-pixels may suffer a greater feed-through effect, and the inconsistency of the feed-through effect may affect the display quality. At this time, the size of the multiplexer may be adjusted by adjusting the number of parallel TFTs. For example, the present disclosure makes the size of the first multiplexer smaller than the size of the second multiplexer to reduce the impact on the image quality due to inconsistent feed-through effects.

Figure 6A:
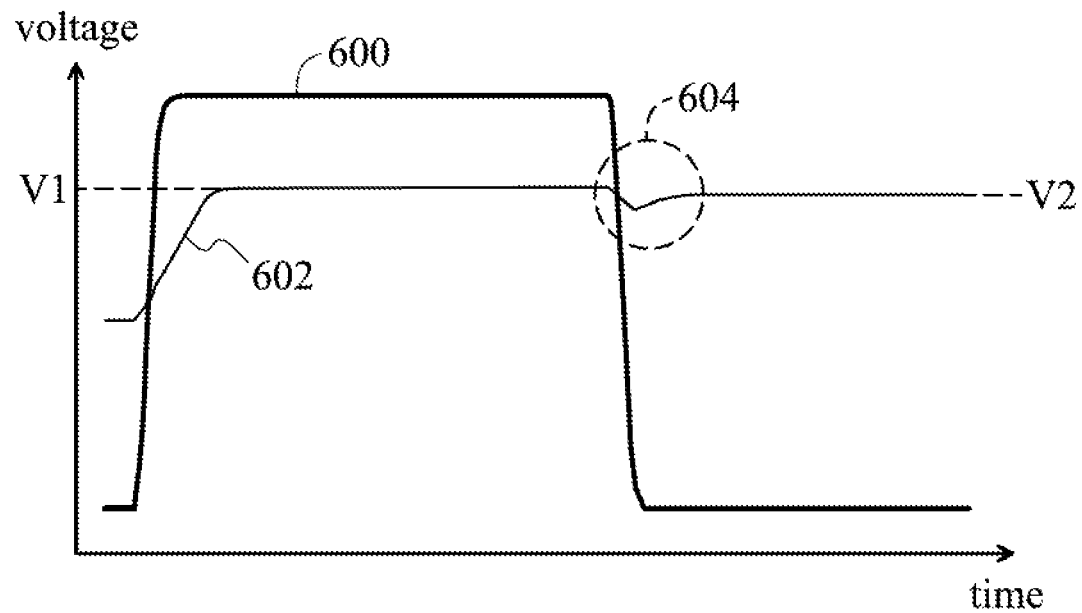
FIG. 6A is a waveform diagram of the first multiplexer before channel width adjustment in accordance with some embodiments of the disclosure.
Figure 6B:
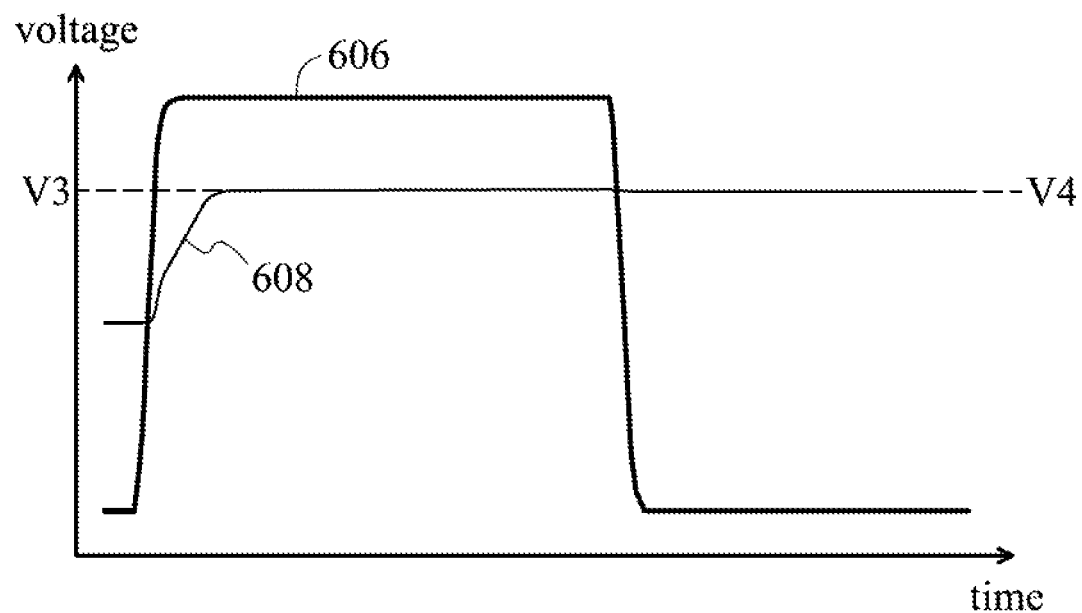
FIG. 6B is a waveform diagram of the second multiplexer in accordance with some embodiments of the disclosure.

Please refer to FIG. 2, FIG. 5, FIG. 6A and FIG. 6B. FIG. 6A is a waveform diagram of the first multiplexer 204 before channel width adjustment in accordance with some embodiments of the disclosure. FIG. 6B is a waveform diagram of the second multiplexer 206 in accordance with some embodiments of the disclosure. In some embodiments, the channel widths W1 and W2 in the first multiplexer 204 and the second multiplexer 206 may be, for example, 50 μm, respectively. As shown in FIG. 6A, the waveform curve 600 is the waveform measured at the gate $\underline{G}$ of the TFT 502 in the first multiplexer 204. As shown in FIG. 6B, the waveform curve 606 is the waveform measured at the gate $\underline{G}$ of the TFT 500 in the second multiplexer 206. In some embodiments, the waveform curves 600 and 606 may be the waveform diagram of the control signal group MUXCKH in FIG. 1 or the waveform diagram of the control signals CKH[1], CKH[2] and CKH[3] in FIG. 2 and so on. The waveform curve 602 is the waveform measured on the drain $\underline{D}$ of the TFT 502 in the first multiplexer 204, and the waveform curve 608 is the waveform measured on the drain $\underline{D}$ of the TFT 500 in the second multiplexer 206.

When the waveform curve 600 (the control signal CKH[2] in FIG. 2) changes from a low level to a high level, the TFT 502 in the first multiplexer 204 is turned on, the source driver 214 in FIG. 2 charges the sub-pixel (for example, the sub-pixel 218 in FIG. 2) electrically connected to the TFT 502 of the first multiplexer 204 to a voltage V1. Therefore, the waveform curve 602 may be measured on the drain $\underline{D}$ of the TFT 502 of the first multiplexer 204. Similarly, when the waveform 606 (the control signal CKH[3] in FIG. 2) changes from a low level to a high level, the TFT 500 in the first multiplexer 206 is turned on, the source driver 214 in FIG. 2 charges the sub-pixel (for example, the sub-pixel 220 in FIG. 2) electrically connected to the TFT 500 of the first multiplexer 206 to a voltage V3. Therefore, the waveform curve 608 may be measured on the drain $\underline{D}$ of the TFT 500 of the first multiplexer 206. Due to the difference in the number of sub-pixels corresponding to the first multiplexer 204 and the second multiplexer 206, when the control signal changes from the high level the low level, and the size of the first multiplexer 204 and the second multiplexer 206 are the same, the waveform curve 602 corresponding to the first multiplexer may generate a more obvious voltage fluctuation (feed-through effect) like the voltage drop 604, and after the voltage drop 604, the waveform curve 602 may return back to the voltage V2. It can be seen from FIG. 6A that the voltage V2 is lower than the voltage V1. In FIG. 6B, the voltage fluctuation of the waveform curve 608 corresponding to the second multiplexer is relatively small, the waveform curve 608 may change from the voltage V3 to the voltage V4, and the voltage V4 is lower than the voltage V3.

When the channel width of the TFT 502 in the first multiplexer 204 is adjusted to, for example, 20 μm, it may be seen from the foregoing description that the feed-through effect of the first multiplexer 204 and the feed-through effect of the second multiplexer 206 may be regarded as substantially the same at this time. Therefore, after adjustment, the waveform measured on the first multiplexer 204 may be close to the waveform 608 of the second multiplexer 206 shown in FIG. 6B. In addition, as shown in FIGS. 6A and 6B, in some embodiments, when the feed-through effect is small, the voltage gap before and after the voltage fluctuation may be small (for example, (V3−V4)<(V1−V2)), but the present disclosure is not limited thereto.

In summary, the present disclosure divides the display panel of a non-rectangular display device, and designs different multiplexer sizes in different display areas (for example, different channel widths in TFT) to improve the display abnormalities caused by the inconsistent feed-through effect in the display device.

The embodiments of the present disclosure are disclosed above, but they are not used to limit the scope of the present disclosure. A person skilled in the art can make some changes and retouches without departing from the spirit and scope of the embodiments of the present disclosure. Therefore, the scope of protection in the present disclosure shall be deemed as defined by the scope of the attached claims.

What is claimed is:

1. A display device, comprising:
a first display area, comprising a plurality of first data lines;
a second display area, adjacent to the first display area and comprising a plurality of second data lines;
a first multiplexer, electrically connected to one of the first data lines;
a second multiplexer, electrically connected to one of the second data lines;
wherein the one of the first data lines is electrically connected to a first number of sub-pixels, the one of the second data lines is electrically connected to a second number of sub-pixels, the first number is less than the second number, and a size of the first multiplexer is smaller than that of the second multiplexer;
wherein the first multiplexer comprises n TFTs, the second multiplexer comprises m TFTs, n and m are positive integers, and n is less than m;
wherein the size of the first multiplexer and the size of the second multiplexer have the following relationship:

$$M' = a \times M$$

$$a = \frac{1}{(N+1) - N \times e^{(k-1)}}, N = 1\sim 10$$

$$k = \frac{p'}{P_{max}}$$

wherein M' is the size of the first multiplexer, M is the size of the second multiplexer, a is a size conversion constant, k is a pixel scale constant, p' is the first number, $P_{max}$ is the second number, and N is a positive integer from 1 to 10.

2. The display device as claimed in claim 1, wherein a channel width of each of the TFTs of the first multiplexer is less than that of each of the TFTs of the second multiplexer.

3. The display device as claimed in claim 1, wherein a first control signal is used to turn on or turn off the first multiplexer, and a second control signal is used to turn on or turn off the second multiplexer.

4. The display device as claimed in claim 1, wherein the first multiplexer is located in a first peripheral area, and the first peripheral area is adjacent to the first display area; the second multiplexer is located in a second peripheral area, and the second peripheral area is adjacent to the second display area.

5. The display device as claimed in claim 1, wherein each of the TFTs of the first multiplexer is an n-type TFT, and each of the TFTs of the second multiplexer is an n-type TFT.

6. The display device as claimed in claim 5, wherein a drain of each of the TFTs of the first multiplexer is electrically connected to the one of the first data lines, and a drain of each of the TFTs of the second multiplexer is electrically connected to the one of the second data lines.

7. The display device as claimed in claim 1, wherein both the first multiplexer and the second multiplexer are electrically connected to a source driver.

8. The display device as claimed in claim 7, wherein when the first multiplexer is turned on, the source driver charges the first number of sub-pixels; and when the second multiplexer is turned on, the source driver charges the second number of sub-pixels.

9. The display device as claimed in claim 1, wherein the size conversion constant is between 0.13 and 1.

10. The display device as claimed in claim 1, wherein each of the TFTs is formed on a glass substrate.

11. The display device as claimed in claim 1, wherein the structure of each of the TFTs comprises a silicon nitride buffer layer, a silicon oxide buffer layer, a semiconductor layer, a gate insulating layer, a silicon nitride interlayer dielectric layer, and a silicon oxide interlayer dielectric layer.

12. The display device as claimed in claim 11, wherein the semiconductor layer comprises a source, a drain, a channel layer, and a lightly doped layer.

13. The display device as claimed in claim 12, wherein the source, the drain, the channel layer, and the lightly doped layer are formed between the silicon oxide buffer layer and the gate insulating layer.

14. The display device as claimed in claim 12, wherein each of the TFTs further comprises a source electrode and a drain electrode; the source electrode of each of the TFTs is electrically connected to the source of each of the TFTs, and the drain electrode of each of the TFTs is electrically connected to the drain of each of the TFTs.

15. The display device as claimed in claim 12, wherein the structure of each of the TFTs further comprises at least one metal layer; and the at least one metal layer forms the gate of each of the TFTs.

16. The display device as claimed in claim 15, wherein a parasitic capacitance is formed between the metal layer and the channel layer.

17. The display device as claimed in claim 16, wherein the channel width of each of the TFTs is adjusted to adjust the feed-through effect caused by the parasitic capacitance.

* * * * *